United States Patent [19]
Weigler et al.

[11] Patent Number: 5,224,022
[45] Date of Patent: Jun. 29, 1993

[54] REROUTE STRATEGY FOR HIGH DENSITY SUBSTRATES

[75] Inventors: William Weigler; Gregory E. Pitts, both of Austin, Tex.

[73] Assignee: Microelectronics and Computer Technology Corporation, Austin, Tex.

[21] Appl. No.: 524,237

[22] Filed: May 15, 1990

[51] Int. Cl.⁵ .............................................. H05K 7/62
[52] U.S. Cl. ................................. 361/409; 174/260; 174/261; 228/180.2; 361/395; 361/400; 361/403; 361/414; 439/48; 257/701
[58] Field of Search .............. 29/845, 846, 847, 850; 174/251, 255, 261, 262, 265; 357/80, 409, 410, 71 R; 361/414, 416, 400, 403, 406, 409, 410, 413; 428/34.6, 35.9; 439/48; 228/180.2

[56] References Cited

U.S. PATENT DOCUMENTS

| | | | |
|---|---|---|---|
| 4,245,273 | 1/1981 | Feinberg et al. | 361/382 |
| 4,346,516 | 8/1982 | Yokouchi et al. | 29/845 |
| 4,371,744 | 2/1983 | Badet et al. | 361/410 |
| 4,458,297 | 7/1984 | Stopper et al. | 361/403 |
| 4,463,059 | 7/1984 | Bhattacharya et al. | 357/71 R |
| 4,472,765 | 9/1984 | Hughes | 361/413 |
| 4,489,364 | 12/1984 | Chance et al. | 361/395 |
| 4,546,413 | 10/1985 | Feinberg et al. | 361/410 |
| 4,549,200 | 10/1985 | Ecker et al. | 357/80 |
| 4,571,451 | 2/1986 | Linsker et al. | 174/68.5 |
| 4,652,974 | 3/1987 | Ryan | 361/395 |
| 4,689,441 | 8/1987 | Dick et al. | 174/68.5 |
| 4,700,016 | 10/1987 | Hitchcock et al. | 174/68.5 |
| 4,710,592 | 12/1987 | Kimbara | 174/68.5 |
| 4,731,704 | 3/1988 | Lochner | 361/400 |
| 4,803,595 | 2/1989 | Kraus et al. | 361/400 |
| 4,814,855 | 3/1989 | Hodgson et al. | 174/25.5 |
| 4,992,892 | 1/1991 | Parla et al. | 361/406 |
| 5,060,116 | 10/1991 | Grobman et al. | 361/409 |

FOREIGN PATENT DOCUMENTS

| | | |
|---|---|---|
| 88308996.3 | 9/1988 | European Pat. Off. . |
| 89102243.6 | 2/1989 | European Pat. Off. . |

*Primary Examiner*—Leo P. Picard
*Assistant Examiner*—D. Sparks
*Attorney, Agent, or Firm*—Arnold, White & Durkee

[57] ABSTRACT

A multilayered electrical interconnect circuit whereby interconnect lines, placed in channel regions throughout a rerouting substrate, function to reroute densely packaged electrical components via geometrically uniform spot links placed upon only the surface layer within each channel region. The interconnect circuit has closely spaced parallel X-and Y-lines orthogonal to one another, each X- and Y-line placed within horizontal and vertical channel regions, respectively, such that electrical connections between closely spaced large-scale integrated circuits or discrete electrical components can be rerouted with a combination of one or more X- and/or Y-lines.

13 Claims, 5 Drawing Sheets

REROUTE STRATEGY FOR HIGH DENSITY SUBSTRATES

BACKGROUND OF THE INVENTION

This invention relates to a reroute strategy for a multilayered electrical interconnect.

A conventional approach for rerouting interconnect lines is to first remove the electrical component's inside lead pads (i.e., bonding pads placed on the electrical component or integrated wire circuit) selected interconnect lines that are fabricated within an underlying interconnect substrate. To remove an interconnect line, a wire bond must be broken at the inside lead pad. After the defective wire is removed, a discrete jumper wire is then attached to the selected inside lead pad. Jumper wires often must travel long distances between electrical components placed on opposite ends of the substrate. If extensive rerouting is required, numerous jumper wires must be attached at target locations throughout the substrate material. If the target connections are concentrated within a small area, discrete wires of large diameter cannot be used. Conversely, if small wires are used, they often prove too fragile to handle. With the advent of very high density interconnects (e.g., line densities exceeding 500 lines/inch/layer) the entire strategy of jumper wire rerouting must be revised. Extensive rerouting cannot be achieved in high density interconnects using conventional jumper wire techniques.

Recently, attempts have been made to place the reroute lines within the interconnect substrate. Instead of using long jumper wires extending between inside lead pads, more recent prior art places part of the reroute line within a multilayered substrate. The embedded interconnect lines are routed through vias to dumbell-shaped pads placed on the surface layer. The dumbell shaped pads are then connected to outside lead pads (i.e., bonding pads placed on the substrate near each electrical component) by short fly-wires. A short wire lead then must connect each outside lead pad to a corresponding inside lead pad. Thus, although part of the interconnect line is placed within a substrate, in order to connect the embedded interconnect lines to selected inside lead pads, both a fly wire and a wire lead are needed. If the fly wires and/or wire leads are long, undesirable impedance affects the system causing signal delays and cross-talk problems. Furthermore, since both the fly wires and wire leads require soldering, there is an increased risk of dislodging the electrical component upon impact causing a less reliable interconnect system. Also, if fly-wires or wire leads are routed across one another, there exists a potential for shorting.

An associated problem inherent with placing reroute lines within the interconnect within the substrate is the inefficient use of the interconnect. Instead of seeking the shortest distance from point A to point B, typical fabricated interconnect layers often route from point A to point B via points C, D, etc., which may be distant from the target area. The interconnect line, for example, from point A to point C and back to point B may be unacceptably long, causing problems similar to those associated with long jumper wires. Often, interconnect lines extend the entire length of the substrate and are not severable at desired locations near the target location. When a connection is made at the target area, the unused interconnect portion extends beyond the link location and forms an unusable stub residing within the substrate. The existence of nonuseable stubs decreases available interconnect lines, thereby forcing a reduction in interconnect density.

SUMMARY OF THE INVENTION

The present invention achieves high density rerouteabiity using uniformly shaped spot links programmable on only a single surface layer. Jumper wires and/or fly-wires are not used. Instead, rerouting is completely done within the interconnect substrate. Interconnect lines can be directly routed to outer lead pads by selectively placing spot links upon the surface layer. The spot links are considerably shorter than fly-wires or jumper wires associated with prior art. Spot links can 1) programmably connect interconnect lines to outside lead pads, and 2) programmably connect horizontal interconnect lines to vertical interconnect lines. Fly-wires are not used to connect interconnect lines to outside lead pads, nor are fly-wires used to connect horizontal interconnect lines to vertical interconnect lines as is commonly done in the prior art. Not only are fly-wires not used, but also, embedded interconnect lines are more directly routed to the target locations. Each interconnect line is severable at the surface layer such that unused interconnect lines or stubs do not remain within the substrate. The stubs of severed interconnect lines can be used by another reroute interconnect.

The present invention achieves rerouting completely within the substrate material by configuring a rerouting substrate below a plurality of electrical components and above a custom substrate containing a custom interconnect. If a custom interconnect line within the custom substrate is found defective or misrouted, the defective custom line can be severed at the surface from its connection to an outside lead pad. Once the custom interconnect is severed, a horizontal or vertical reroute line configured within the reroute substrate is selectively connected to the outside lead pad. Outside lead pads can be connected to X-lines or Y-lines by reroute structures placed upon the surface layer and between electrical components. Both X-lines and Y-lines are placed in horizontal and vertical channel regions, respectively within the rerouting substrate below the space between electrical components. The X-lines extend as parallel groups of horizontal lines, each group extending within each horizontal channel region the entire width of the rerouting substrate. The Y-lines are vertical groups of parallel lines, each group extending within the vertical channel regions the entire length of the rerouting substrate. An intersection reroute structure is placed at each location where horizontal and vertical channel regions intersect. The intersection reroute structure function to connect selected X- and Y-lines such that routing interconnect can change directions at a 90° angle.

Instead of soldering fly-wires from pad-to-pad (at areas where X- and Y-lines overlap and where X- and Y-lines are brought in close proximity to outside lead pads) as in the prior art, all programmed connections at the intersections and target areas are done by uniformly shaped spot links rather than point-to-point wire bonds. Spot links can be placed upon desired locations of the surface layer by mechanical bonding techniques, direct laser deposition or etching/fabrication techniques. It is to be appreciated that spot links of the present invention can easily be formed by using a conventional wire border set to break the wire immediately above the gold ball or by dispensing a small dot or ball of conductive epoxy. Either methods provide satisfactory results.

DETAILED DESCRIPTION OF THE PREFERRED EMBODIMENTS

Figure 1:
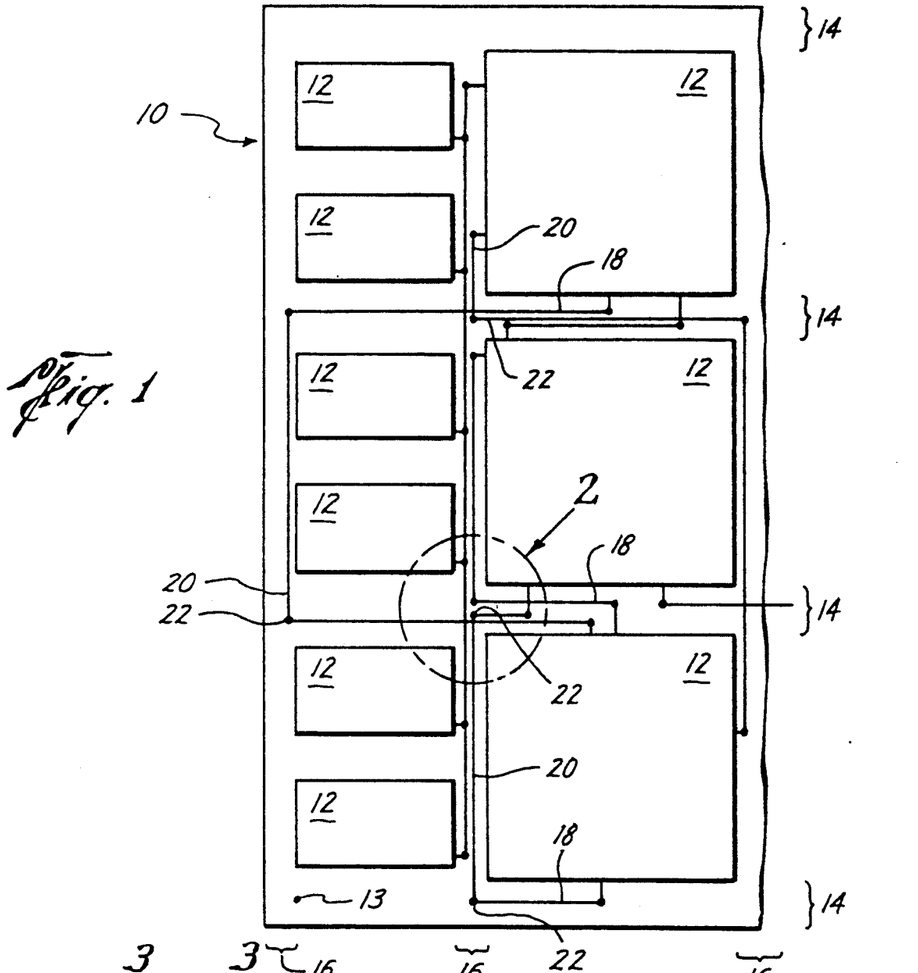
FIG. 1 is a partial top plan view of a multilayer electrical interconnect substrate of the present invention illustrating interconnect lines placed within channels between electrical components.

Referring to the drawings, FIG. 1 is a partial top view of a multilayer electrical interconnect substrate 10 upon which nine electrical components 12 are shown bonded to top surface 13. Electrical components 12 can be of any size or shape provided the spacing between each electrical component 12 allows for horizontal channels 14 and vertical channels 16 to exist, in collinear fashion, across the entire multilayer interconnect substrate 10. A plurality of X-lines 18 traverse each horizontal channel 14, and a plurality of Y-lines 20 traverse each vertical channel 16. In order to avoid confusion, only selected ones of the plurality of X-lines 18 and plurality of Y-lines 20 are shown in FIG. 1. X-lines 18 are connectable to each electrical component 12 within selected horizontal channels 14. Meanwhile, Y-lines 20 are connectable to each electrical component 12 within selected vertical channels 16. Also, any selected X-line 18 can be connected to a selected Y-line 20 at crossover regions 22.

Figure 2:
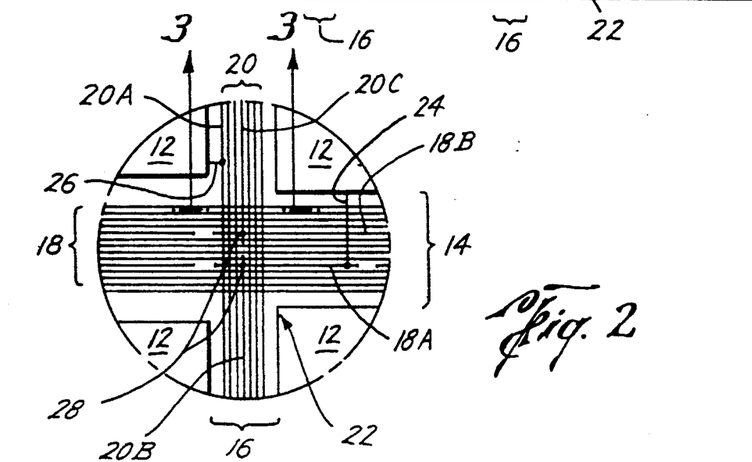
FIG. 2 is a top view of a portion of the substrate shown in FIG. 1 illustrating connections to parallel interconnect lines placed within horizontal and vertical interconnect channels.

FIG. 2 is a detailed top view of crossover region 22 of FIG. 1. Contained within each horizontal channel 14 are a plurality of X-lines 18 of which a selected X-line 18A is shown connected to adjacent electrical component 12 via horizontal channel reroute structure 24. Contained within each vertical channel 16 are a plurality of vertical Y-lines 20 of which a selected Y-line 20A is shown connected to adjacent electrical component 12 via vertical channel reroute structure 26. X-lines 18 and Y-lines 20 cross at a plurality of right angles within cross-over section 22. X-lines 18 can be connected to overlying or underlying Y-lines 20 via channel intersection reroute structure 28. Any selected X-line 18 or Y-line 20 can be severed at the surface of substrate 10 near horizontal channel reroute structure 24, vertical channel reroute structure 26, and/or channel intersection reroute structure 28. FIG. 2 illustrates a connection made in both the horizontal and vertical reroute structure 24 and 26, respectively, and two connections made in channel intersection reroute structure 28. Y-line 20A extends the entire vertical channel 16, and is shown in FIG. 2 making connection to electrical component 12 via vertical channel reroute structure 26. Y-line 20A does not require partitioning as does Y-line 20B shown as being severed within channel intersection reroute structure 28 such that Y-line 20B connects to X-line 18A. Neither Y-line 20B or X-line 18A extend above or to the left of channel intersection reroute structure 28. By severing Y-line 20B above channel intersection reroute structure 28, the unused portion or stub 20C can be used to connect to X-line 18B, which extends within horizontal channel 14 to be used elsewhere within the substrate 10.

FIG. 2 illustrates that selected X-lines 18A can be connected to above-configured electrical component 12 by using a horizontal channel reroute structure 24. Although not shown, selected X-line 18A could just as easily be connected to below-configured electrical component 12 through horizontal channel reroute structure 24. Also, Y-line 20A could easily be connected to right- as well as left-configured electrical component 12 through vertical channel reroute structure 26. After making connection to either horizontal or vertical channel reroute structure 24 or 26 respectively, X- or Y-lines 18 or 20, respectively, can be severed at a point beyond the connection. The severed lines or stub can then be used in interconnection networks needed elsewhere in substrate 10. By severing the unused portion from the used line portion, the unused portion can potentially be reused allowing for a more efficient use of interconnect. Therefore, more reroutes can be performed with the limited number of interconnect lines provided.

Figure 3:
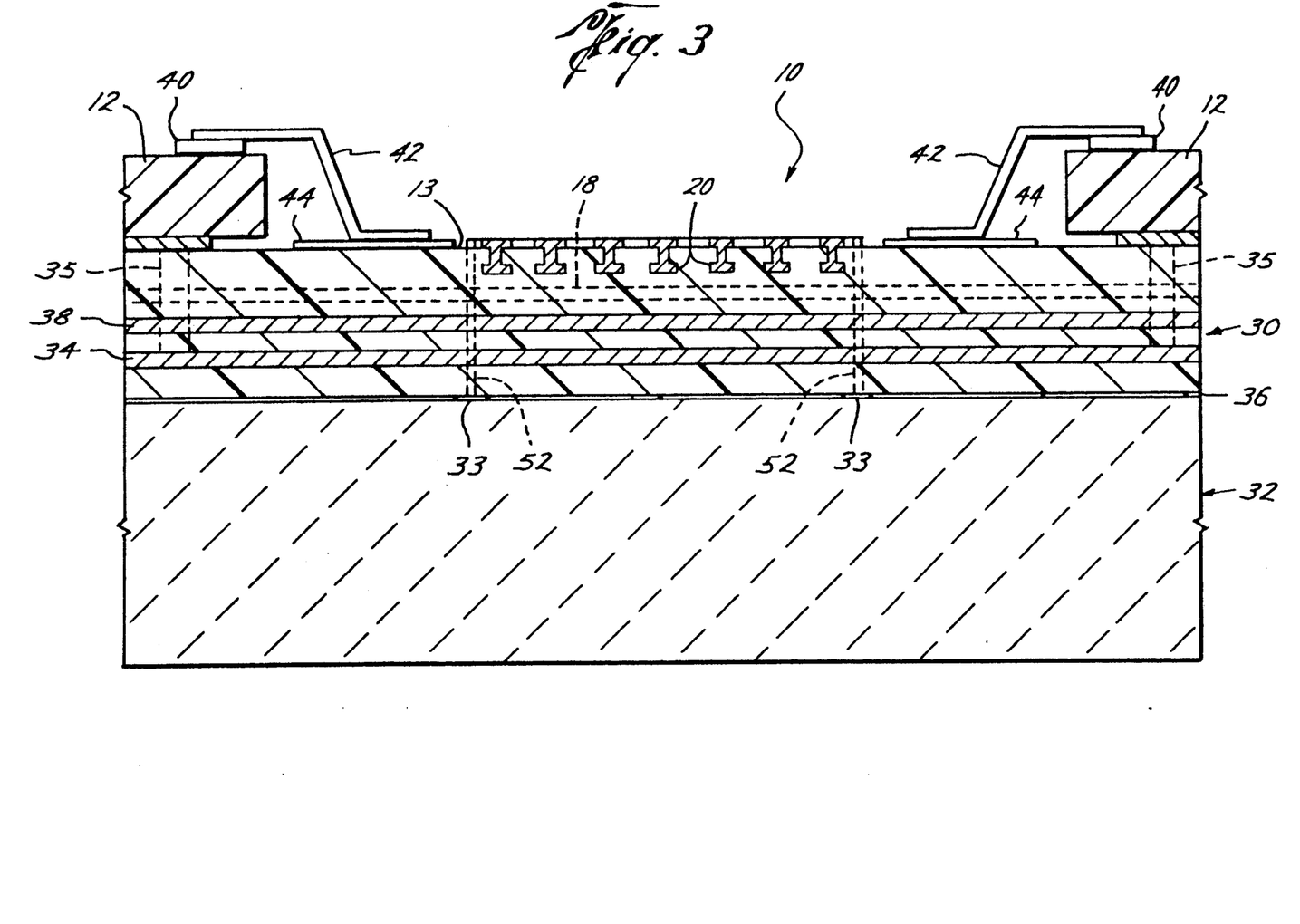
FIG. 3 is a cross-sectional side view of a multilayer electrical interconnect substrate of the present invention along plane 3—3 of FIG. 2 and FIG. 5.
Figure 5:
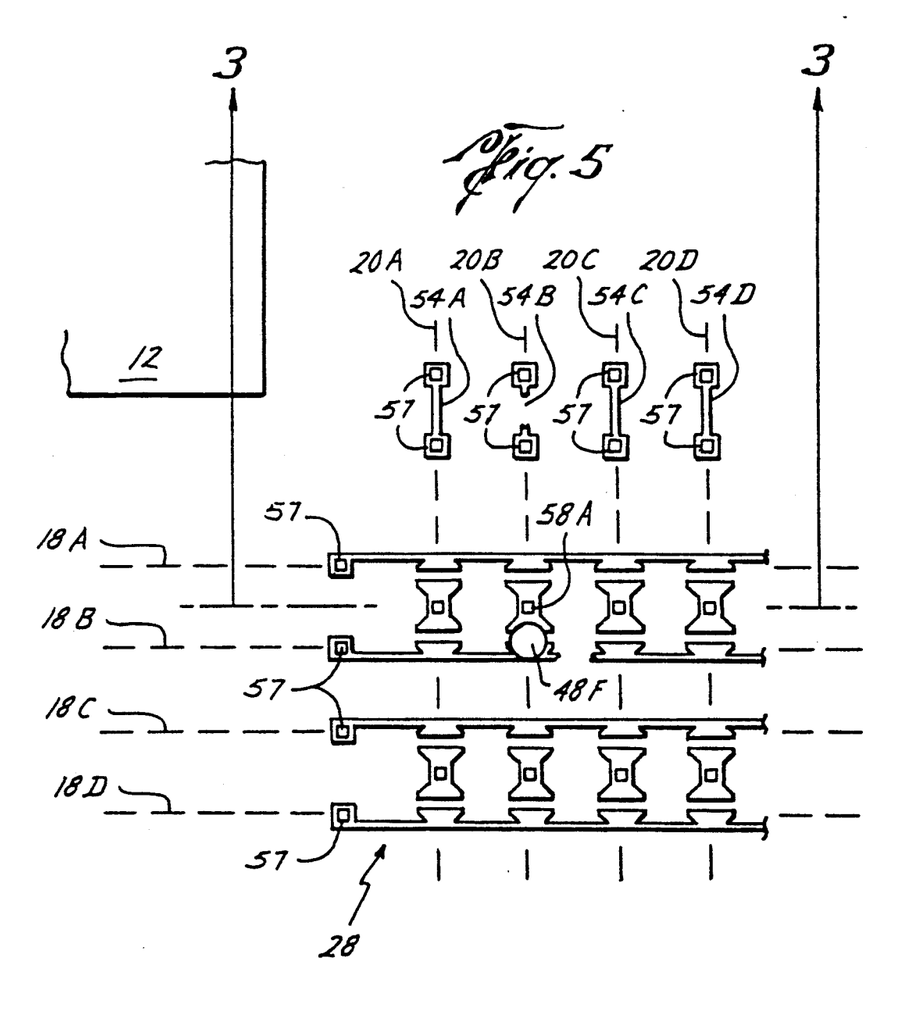
FIG. 5 is a top view of a channel intersection reroute structure of the present invention placed within a horizontal and vertical channel intersection region.

FIG. 3 is a cross-sectional side view of multilayer interconnect substrate 10 along plane 3—3 of FIGS. 2 and 5. Interconnect substrate 10 comprises reroute substrate 30 placed above custom substrate 32. Included within reroute substrate 30 are electrically insulated multiple layers. Grounding layer 34 is shown electrically insulated from power layer 38 and configured below power layer 38. While it is preferred that grounding layer 34 and power layer 38 be planar, the layers can instead be lines without deviating from the invention. Grounding layer 34 can be electrically attached to the bottom of electrical component 12 through risers 35 extending through openings in above-configured power layer 38. Risers 35 are positioned through the opening such that they are electrically insulated from power layer 38. Also placed within reroute substrate 30, and preferably above the ground and power layers 34 and 38, are orthogonally placed X-lines 18 and Y-lines 20. Although X-lines 18 are shown above Y-lines 20, placing Y-lines 20 above X-lines 18 will not change the function of the invention. Also, while it is preferred that power layer 38 be placed below X-lines 18 and Y-lines 20, power layer 38 can be placed above X- and Y-lines 18 and 20.

Also shown in FIG. 3 is an inside lead pad 40 placed on the top surface of electrical component 12. Attached to the upper surface of inside lead pad 40 is a wire lead 42 extending from inside lead pad 40 downward to outside lead pad 44 configured on top surface 13 of reroute substrate 30. Inside lead pad 40 can also be placed on the bottom surface of a packaged electrical component 12 in a TABed-mount configuration such that wire lead 42 horizontally connects the underside lead pad to outside lead pad 44. As shown in FIG. 3, contained within custom substrate 32, and as an upper layer of custom substrate 32, is polyimide isolation/planation layer 36. Contained within polyimide isolation planarization layer 36 is a plurality of custom interconnect lines 33 which connect to bonding pads 44 through custom vias 52 contained within horizontal and vertical channels 14 and 16, respectively.

FIG. 3 illustrates multilayer interconnect substrate 10 placed below electrical component 12, and where X- and Y-lines 18 and 20 are configured within multilayered interconnect substrate 10. The X- and Y-lines 18 and 20 are placed only within reroute substrate 30 and horizontal and vertical channels 14 and 16. Defective custom interconnect lines, which are fabricated within polyimide isolation/planarization layer 36, are removable from outside lead pads 44 by severing the custom interconnect lines at selective points on surface layer 13. Once defective custom lines are removed, then X- or Y-lines 18 or 20 respectively, can be attached through reroute substrate 30 to desired outside lead pads 44. Techniques by which X- or Y-lines 18 or 20 are channeled to selective outside lead pads 44 are shown in the remaining Figures.

Figure 4A:
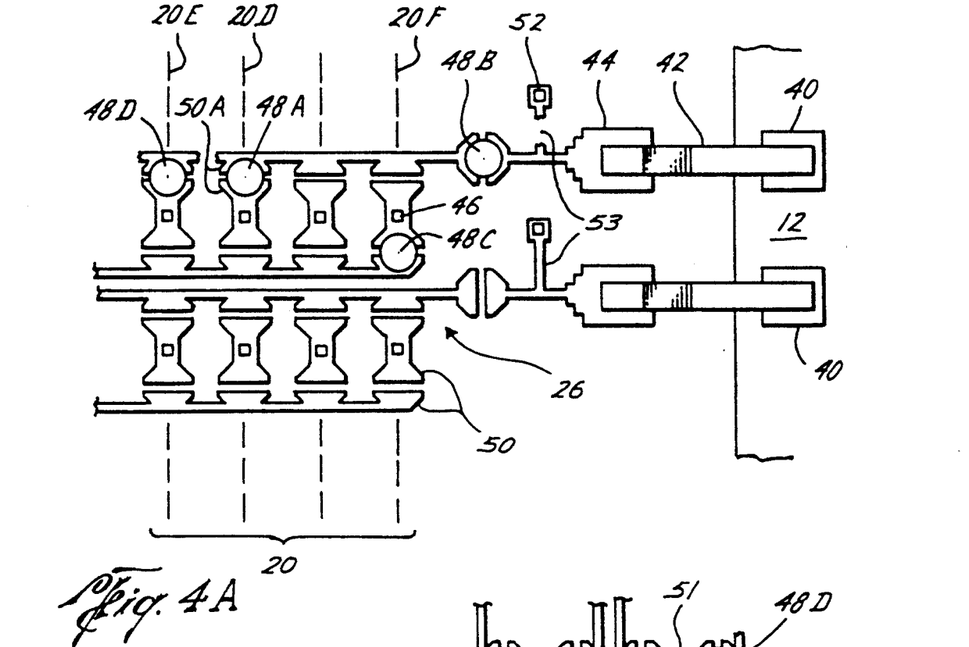
FIG. 4a is a top view of a vertical channel reroute structure of the present invention placed within a vertical channel in close proximity to the outer boundary of an electrical component.

FIG. 4a is a top view of vertical channel reroute structures 26 placed within vertical channel 16. Vertical Y-lines 20 are connectable to vertical channel reroute structure 26 by vertical channel vias 46 extending downward from surface layer 13, upon which vertical channel reroute structure 26 resides, to underlying Y-lines 20. For example, selected Y-line 20D is connectable to outside lead pad 44 by placing spot links 48A and 48B upon selected surfaces of vertical channel reroute structure 26. Spot links 48A and 48B can be of any uniform shape as long as they form conductive links upon the surface of split pads 50. Gold ball bonds are preferred to bridge across the gap between split pads 50. Conductive balls can easily be formed by using a conventional wire border set to break the wire immediately above the ball. Also, spot links can be formed by dispensing a small ball or dot of conductive epoxy between split pads 50. Further, it may also be possible to merely smear solder across the gap of split pad 50, or to laser-deposit metal links across split pads 50. All of the above methods have been successfully used on split pads of 3 mil diameter. Once a spot link 48 is made, the vertical channel reroute structure 26 can be severed on surface layer 13 so that unused portions of vertical channel reroute structure 26 do not interfere with the used portion. Vertical channel reroute structure 26 is shown severed near spot link 48A so that Y-line 20E will not also be connected to outside lead pad 44. Although not shown in FIG. 4a Y-line 20F is connectable to left-configured outside lead pads by spot link 48C.

FIG. 4a also illustrates a method for correcting previous modifications. If Y-line 20E was initially routed to bonding pad 44 by use of spot link 48D, and then it was discovered that Y-line 20E was defective, Y-line 20D can subsequently be connected to bonding pad 44 by severing vertical channel reroute structure 26 between Y-line 20D and Y-line 20E, and then connecting Y-line 20D to outside lead pad 44 by placing spot link 48A upon split pad 50A. Thus, as a precaution, Y-line 20E should initially be selected which is furtherest from outside lead pads 44 so that if it becomes necessary to revise the connection, a nearer Y-line, for example 20D, can be selected by bonding the corresponding split pad 50A and severing the surface path of vertical channel reroute structure 26.

Before vertical channel reroute structure 26 can be linked to outside lead pad 44, custom vias 52, formed at terminal ends of each custom interconnect line, must be removed from corresponding bonding pad 44. Custom vias 52 are removed from outside lead pad 44 by severing custom junction 53 upon surface layer 13. Custom junctions 53 or vertical channel reroute structures 26 can be severed or cut with a single point bonder tool which has been successfully demonstrated to cut surface traces 15 microns wide spaced with a pitch of 50 microns. An alternate method of cutting surface traces involves discharging a capacitor between two closely spaced electrical contacts positioned on the surface trace. Laser-cutting methods can also be used to cut the traces without interfering with adjacent surface traces.

Figure 4B:
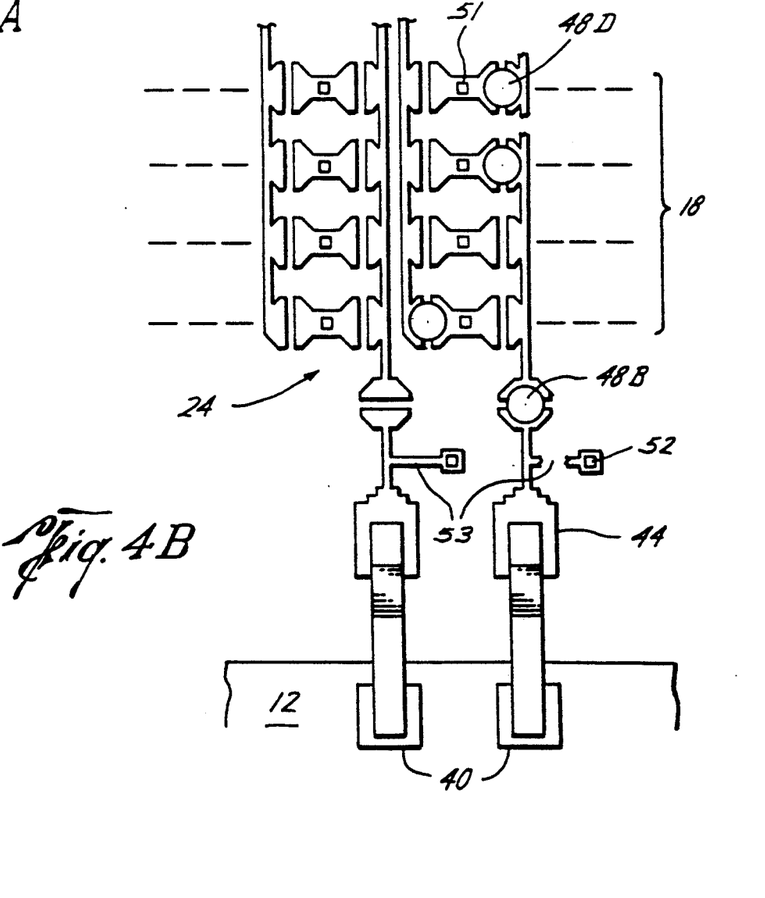
FIG. 4b is a top view of a horizontal channel reroute structure of the present invention placed within a horizontal channel in close proximity to the outer boundary of an electrical component.

Although FIG. 4a has been used to illustrate vertical channel reroute structures 26 placed within vertical channels 16, it is to be appreciated that, once rotated 90°, FIG. 4a is equally applicable to horizontal channel reroute structure 24 placed within horizontal channel 14. FIG. 4b illustrates a horizontal channel reroute structure 24 having X-lines 18 selectively connectable to outside lead pads 44. Horizontal channel vias 51 connect horizontal channel reroute structure 24 downward to an underlying X-lines 18. Like the vertical channel reroute structure 26, horizontal channel reroute structure 24 is also surface severable at locations near selected spot links 48.

Placed in close proximity to outside lead pad 44, shown in both FIG. 4a and 4b, are inside lead pads 40. Inside lead pads 40 are placed on the top surface near the outer edges of each electrical component 12. Connecting outside lead pads 44 to inside lead pads 40 are a series of wires leads 42. The outside lead pads 44 are configured near the target inside lead pads 40 so that each wire lead 42 is short and does not cross adjacent wire leads 42.

FIG. 5 is a top view of channel intersection reroute structure 28 having a plurality of surface links 54A, 54B, 54C and 54D. Each surface link is shown connected to a pair of surface vias 57, each surface via 57 extending downward from terminal ends of surface links 54 to terminal ends of Y-lines 20A, 20B, 20C or 20D. Surface via 57 also connects terminal ends of channel intersection reroute structure 28 downward to terminal ends of X-lines 18A, 18B, 18C and 18D. Surface link 54B is shown severed such that Y-line 20E is separated from Y-line 20B. Channel intersection reroute structure 28 can be severed at desired locations such that any unused portion or trace can be separated from used portions. FIG. 5 illustrates a technique by which X-line 18B is routed to Y-line 20B through surface vias 57, intersection vias 58A and spot link 48F. Y-line 20B is severed by cutting surface link 54B such that collinear Y-line 20E is separated from Y-line 20B. Although FIG. 5 illustrates surface links 54A-D connecting Y-lines 20A-D, and channel intersection reroute structure 28 connecting X-lines 18A-D, it is to be appreciated that surface links 54 can extend horizontal rather than vertical over terminal ends of X-lines 18 and that channel intersection reroute structure 28 can extend vertically over terminal ends of Y-lines 20 rather than X-lines 18. Either embodiment can be used without altering the performance of the present invention.

Figure 6:
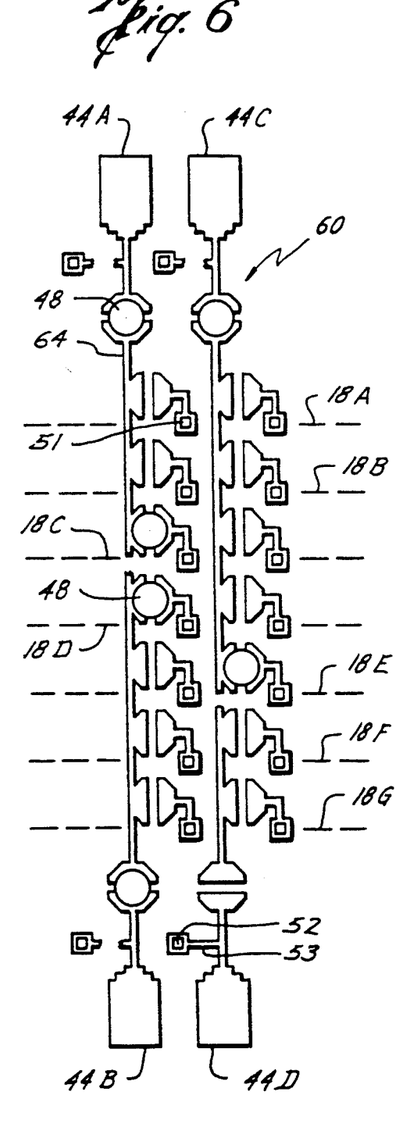
FIG. 6 is a top view of an alternative embodiment channel reroute structure of the present invention.

FIG. 6 is a top view of a smaller pitch horizontal channel reroute structure 60. X-lines 18A-G are shown attached to smaller pitch horizontal channel reroute structure 60 by horizontal channel vias 51 and selectively placed spot links 48. In the example of FIG. 6, X-line 18C is chosen to be routed to bonding pad 44A, X-line 18D is chosen to be routed to bonding pad 44B, and X-line 18E is routed to bonding pad 44C. Meanwhile, bonding pad 44D remains connected to underlying custom interconnect lines through custom via 52 and custom junction 53.

Figure 7:
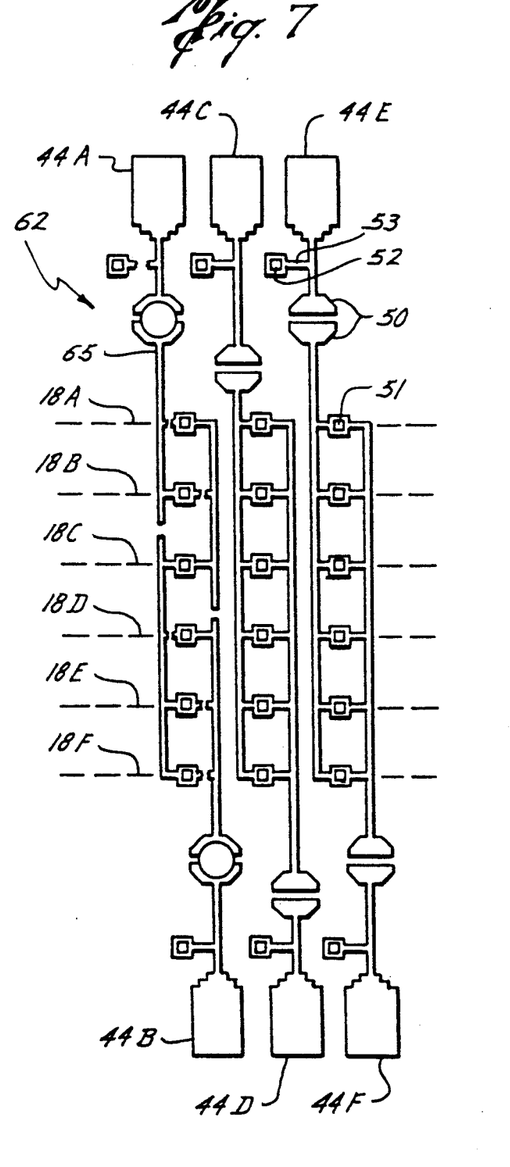
FIG. 7 is a top view of another alternative embodiment channel reroute structure of the present invention.

FIG. 7 is a top view illustrating extremely small pitch horizontal channel reroute structure 62. Normal pitch between outside lead pads 44 is 8 to 9 mils, however, for smaller pitches, possibly as low as 5 or 6 mils, a single vertical trace 64, shown in FIG. 6, is used instead of a double trace configuration used in FIGS. 4a and 4b. For extremely small pitch outside lead pads 44 shown in FIG. 7, minimum sized 3-mil split pads 50 are staggered along the top and bottom row of outside lead pads 44. Initially, the entire vertical trace 65 is shorted, and discrete sections of vertical trace 65 are severed such that selected X-lines are connected to selected bonding pads 44. Extremely small pitch horizontal channel structure 62 requires many cuts to be made along each vertical trace 65, however, path of loading is reduced and the spare lines can be placed closer together. Other variations of extremely small pitch horizontal channel reroute structure 62 are possible, such as a single feeder line for bonding pads 44 on opposite sides of horizontal channel 14, and rearrangement of the horizontal channel vias 51 to prevent possible severing of the underlying X-lines 18 when vertical trace 65 is cut. FIG. 7 illustrates, for example, a technique by which outside lead pad 44A is connected to X-line 18B, and outside lead pad 44B is connected to X-line 18D. Bonding pads 44C–44F remain connected to custom interconnect lines through custom junctions 53 and custom vias 52. Although FIGS. 6 and 7 show small and extremely small pitch horizontal channel reroute structures 60 and 62, respectively, placed in horizontal channels 14, the reroute structure can be rotated 90° and placed in vertical channels 16 connecting vertical Y-lines 20 to selected vertical columns of outside lead pads 44.

FIGS. 4a, 4b, 5, 6 and 7 are only partially indicative of the number of X-lines 18 and Y-lines 20 contained within each horizontal and vertical channel 14 and 16. There are numerous other outside lead pads 44 contained within the interconnect substrate 10 and not shown by the Figures. Therefore, it is understood that the invention is not confined to the particular construction set forth herein, but embraces such modified forms thereof which come within the scope of the following claims.

What is claimed is:

1. A multilayer electrical interconnect substrate for interconnecting a plurality of electrical components, comprising:
    a plurality of electrical component mounting sites arranged to form horizontal and vertical regions between said sites, said horizontal and vertical regions extending the entire length and width of each of said sites;
    a custom substrate comprising custom interconnect lines placed within said custom substrate and a plurality of custom vias formed at the terminal ends of each said custom interconnect line;
    a rerouting substrate connected to said custom substrate and configured between said electrical component mounting sites and said custom substrate, said rerouting substrate comprising:
    i) a plurality of substantially parallel, X-lines placed in groups within said rerouting substrate, each group of said X-lines configured within horizontal channel regions extending between said electrical component mounting sites and extending substantially the entire length of said rerouting substrate;
    ii) a plurality of substantially parallel, Y-lines placed in groups within said rerouting substrate, each group of said Y-lines configured within vertical channel regions between said electrical component mounting sites and extending substantially the entire length of said rerouting substrate; said X- and Y - lines overlapping each other at a plurality of cross-over regions where each said horizontal and vertical channel regions intersect;
    a surface layer connected to said rerouting substrate and placed between said rerouting substrate and said electrical component mounting sites, said surface layer comprising:
    i) a plurality of outside lead pads surrounding each said electrical component mounting site;
    ii) a plurality of horizontal channel reroute structures placed within the horizontal channel region, each having a plurality of horizontal channel vias for connecting the horizontal channel reroute structure to a plurality of said X-lines;
    iii) a plurality of vertical channel reroute structures placed within the vertical channel region, each having a plurality of vertical channel vias for connecting the vertical channel reroute structure to a plurality of said Y-lines;
    iv) a plurality of channel intersection reroute structures, each channel intersection reroute structure placed within each said cross-over region, each channel intersection reroute structure having a plurality of intersection vias for connecting the channel intersection reroute structure to a plurality of said X-and Y-lines;
    a plurality of spot links, each spot link having substantially uniform geometry and being receivable on each said horizontal channel reroute structure, on each said vertical channel reroute structure and on each said channel intersection reroute structure for selectively connecting said outside lead pads to said X-lines and said Y-lines; and
    means for detaching selected ones of said outside lead pads from said custom interconnect lines and for partitioning each said horizontal channel reroute structure, each said vertical channel reroute structure and each said channel intersection reroute structure upon said surface layer.

2. The multilayer electrical interconnect of claim 1, said custom substrate and said rerouting substrate further comprising insulating material separating said X-lines and Y-lines.

3. The multilayer electrical interconnect substrate of claim 1, each said horizontal channel reroute structure, each said vertical channel reroute structure, each said channel intersection reroute structure further comprising:
    a plurality of split pads, each said split pad having a pair of semicircular pads selectively connectable by placing said spot link on said split pad substantially covering the pair of said semicircular pads.

4. The multilayer electrical interconnect structure of claim 3, each said split pad including a substantially circular surface plane split into two half circular planes separated by a gap.

5. The multilayer electrical interconnect structure of claim 1, said detaching means comprising severable surface links placed on said surface layer.

6. The multi-layer interconnect of claim 1, wherein said spot links comprise gold balls formed with a wire bonding apparatus.

7. An interconnect circuit comprising:

a plurality of electrical components arranged wherein horizontal and vertical regions exist between spacings between components, said horizontal and said vertical regions extending the entire length and width of each of said electrical components, each of said electrical components having a plurality of inside lead pads placed on a top surface of each said component and near outer boundaries of each said electrical component;

a multilayer substrate disposed beneath said plurality of electrical components, said substrate comprising:

a custom substrate comprising custom interconnect lines placed within said custom substrate and a plurality of custom vias formed at the terminal ends of each said custom interconnect line;

a rerouting substrate connected to said custom substrate and configured between said electrical components and said custom substrate, said rerouting structure comprising:

i) a plurality of substantially parallel X-lines placed in groups within said rerouting substrate, each group of X-lines configured within horizontal channel regions disposed directly below said horizontal regions;

ii) a plurality of substantially parallel Y-lines placed in groups within said rerouting substrate, each group of Y-lines configured within vertical channel regions disposed directly below said vertical regions, said X- and Y-lines overlapping at a plurality of cross-over regions where each said horizontal and vertical regions intersect;

a surface layer connected to said rerouting substrate and placed between said rerouting substrate and said electrical components, said surface layer comprising:

i) a plurality of outside lead pads surrounding each said electrical component and connectable thereto;

ii) a plurality of horizontal channel reroute structures placed within the horizontal channel region, each having a plurality of horizontal channel vias for connecting the horizontal channel reroute structure to a plurality of said X-lines;

iii) a plurality of vertical channel reroute structures placed within the vertical channel region, each having a plurality of vertical channel vias for connecting the vertical channel reroute structure to a plurality of said Y-lines;

iv) a plurality of channel intersection reroute structures, each channel intersection reroute structure placed within each said cross-over region, and having a plurality of intersection vias for connecting the channel intersection reroute structure to a plurality of said X- and Y-lines;

a plurality of spot links, each said spot link having substantially uniform geometry and being receivable on each said horizontal and vertical channel reroute structures, and each said channel intersection reroute structure for selectively connecting said outside lead pads to said X-lines and said Y-lines; and, means for detaching said outside lead pads from said custom interconnect lines and for partitioning each said horizontal channel reroute structure, each said vertical channel reroute structure and each said channel intersection reroute structure upon said surface layer.

8. The interconnect circuit of claim 7, each said horizontal channel reroute structure, each said vertical channel reroute structure and each said channel intersection reroute structure further comprising modification means for detaching select ones of said X-lines and said Y-lines, and then attaching said X-lines and said Y-lines that are adjacent to detached X-lines and Y-lines.

9. The interconnect circuit of claim 7, said rerouting substrate further comprising insulating material separating said X-lines and said Y-lines.

10. An interconnect circuit of claim 7, each said horizontal channel reroute structure, each said vertical channel reroute structure, each said channel intersection reroute structure further comprising a plurality of splitpads, each said split pad selectively connectable by placing said spot link on and between each said split pad.

11. The interconnect circuit of claim 7, said detaching means comprising severable surface links placed on said surface layer.

12. The interconnect circuit of claim 7, each said split pad including a substantially circular planar structure split into two half circular planes separated by a gap.

13. The multi-layer interconnect of claim 7, wherein said spot links comprise gold balls formed with a wire bonding apparatus.

* * * * *